(12) United States Patent
Ikeda et al.

(10) Patent No.: US 7,561,863 B2
(45) Date of Patent: Jul. 14, 2009

(54) AUTOMATIC GAIN CONTROL DEVICE

(75) Inventors: Takeshi Ikeda, Ohta-ku (JP); Hiroshi Miyagi, Kohoku-ku (JP)

(73) Assignee: Niigata Seimitsu Co., Ltd., Jyoetsu-shi (JP)

( * ) Notice: Subject to any disclaimer, the term of this patent is extended or adjusted under 35 U.S.C. 154(b) by 434 days.

(21) Appl. No.: 11/441,055

(22) Filed: May 26, 2006

(65) Prior Publication Data

US 2006/0217094 A1    Sep. 28, 2006

Related U.S. Application Data

(63) Continuation of application No. PCT/JP2004/10246, filed on Jul. 12, 2004.

(30) Foreign Application Priority Data

Nov. 26, 2003  (JP)  ............................. 2003-396076

(51) Int. Cl.
*H04B 1/06* (2006.01)
*H04B 7/00* (2006.01)
(52) U.S. Cl. .............. 455/232.1; 455/245.2; 455/249.1; 375/345
(58) Field of Classification Search ................. 455/136, 455/138, 232.1–253.2; 375/345
See application file for complete search history.

(56) References Cited

U.S. PATENT DOCUMENTS 5,465,408 A    11/1995    Sugayama et al.
6,625,433 B1   9/2003     Poirier et al.
7,212,798 B1 * 5/2007     Adams et al. ............. 455/251.1
7,227,916 B2 * 6/2007     Ruelke et al. ............... 375/345
2003/0153289 A1 * 8/2003  Hughes et al. ............... 455/138

(Continued)

FOREIGN PATENT DOCUMENTS

EP        0 657 997        6/1995

(Continued)

OTHER PUBLICATIONS

Supplementary European Search Report under Article 153(7) EPC.

(Continued)

*Primary Examiner*—Simon D Nguyen
(74) *Attorney, Agent, or Firm*—Connolly Bove Lodge & Hutz LLP; Myron Keith Wyche (57) ABSTRACT

A received signal level is detected in each of a wide band, middle band, and narrow band and each detected signal is converted to a digital signal. A DSP 18 determines the enabled/disabled state of an LNA 3 and an attenuator 4 as well as a gain adjustment amount based on the signal level of each band. For example, the gain adjustment is not performed when the signal level of the narrow band including a desired frequency is not larger than a prescribed value even the signal level of the wide band or middle band is larger than a prescribed value. When the signal level of the narrow band is larger than the prescribed value exceeding a gain adjustable limit level in the attenuator 4, the gain of the LNA 3 is adjusted, while maintaining the gain adjustable amount in the attenuator 4 around the limit level, to reduce the gain as a whole.

5 Claims, 8 Drawing Sheets

U.S. PATENT DOCUMENTS

2003/0176174 A1* 9/2003 Seppinen et al. ......... 455/226.1

FOREIGN PATENT DOCUMENTS

| | | |
|---|---|---|
| JP | 05-110464 | 4/1993 |
| JP | 07-079171 | 3/1995 |
| JP | 07-336247 | 12/1995 |
| JP | 09-107304 | 4/1997 |
| JP | 10-022943 | 1/1998 |
| JP | 11-261431 | 9/1999 |
| JP | 2001-102947 | 4/2001 |
| JP | 2001-352266 | 12/2001 |

OTHER PUBLICATIONS

Supplementary European Search Report under Article 153(7) EPC dated May 29, 2008.

* cited by examiner

LNA

FIG. 4B

ATTENUATOR

AUTOMATIC GAIN CONTROL DEVICE

This application is a Continuation of PCT/JP2004/010246 filed Jul. 12, 2004 which designated the United States and which in turn claims priority from Japanese Application 2003-396076, filed Nov. 26, 2003.

FIELD OF THE INVENTION

The present invention relates to an automatic gain control device and specifically to a device for performing automatic gain control (AGC) to suppress signal distortion occurred when a strong signal is inputted to a wireless communication device such as a radio receiver.

DESCRIPTION OF THE RELATED ART

Figure 1:
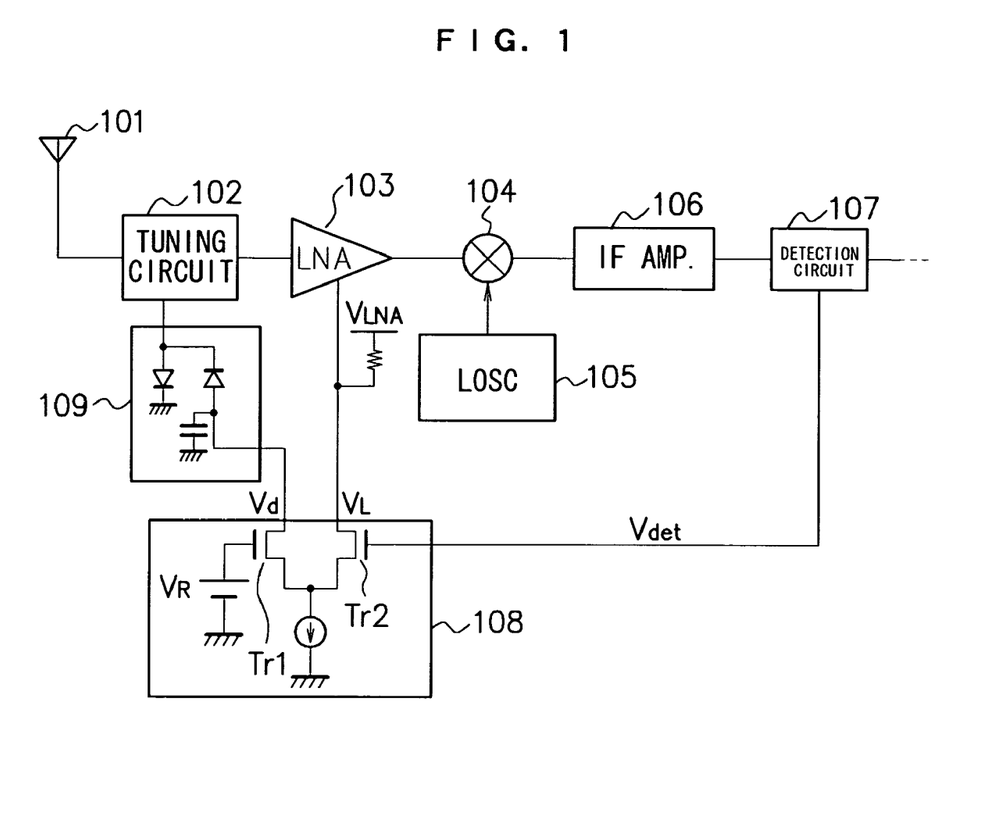
FIG. 1 is a diagram showing a partial configuration of a radio receiver including a conventional AGC circuit.

In general, an AGC circuit is provided in a wireless communication device such as a radio receiver in order to adjust the gain of a received signal. FIG. 1 is a diagram showing a partial configuration of a radio receiver including a conventional AGC circuit. As shown in FIG. 1, the conventional radio receiver comprises an antenna 101, tuning circuit 102, low noise amplifier (LNA) 103, mixer circuit 104, local oscillation circuit 105, intermediate frequency amplifier circuit (IF amplifier) 106, detection circuit 107, differential amplifier 108, and attenuator 109.

The tuning circuit 102 and LNA 103 constitute a high frequency amplifier circuit. The high frequency amplifier circuit selectively amplifies a radio wave in the particular frequency band among broadcast waves received in the antenna 101. The amplification gain is determined by a power supply voltage $V_{LNA}$ which is supplied to a control terminal of the LNA 103 and a voltage $V_L$ (described below) which appears at one end of the differential amplifier 108. The power supply voltage $V_{LNA}$ is adjusted to provide a maximum gain to the LNA 103.

The mixer circuit 104 and local oscillation circuit 105 constitute a frequency converter. The frequency converter mixes a carrier signal outputted from the LNA 103 and a local oscillation signal outputted from the local oscillation circuit 105 in the mixer circuit 104 to convert the frequency, generating an intermediate frequency signal to be outputted.

The intermediate frequency amplifier circuit 106 amplifies the intermediate frequency signal generated in the mixer circuit 104. The detection circuit 107 detects the intermediate frequency signal outputted from the intermediate frequency amplifier circuit 106 and extracts a direct current component which follows to one of differential input terminals in the differential amplifier 108 as an AGC voltage $V_{det}$. A reference voltage $V_R$ is supplied to the other differential input terminal in the differential amplifier 108.

The differential amplifier 108 comprises a differential pair comprising two transistors Tr1 and Tr2. The drain of the transistor the Tr1 is connected to the PIN diode of the attenuator 109, while the drain of transistor Tr2 is connected to the control terminal of the LNA 103. The differential amplifier 108 having such configuration performs amplification according to a differential voltage between a reference voltage $V_R$ supplied to the gate of the transistor Tr1 and an AGC voltage $V_{det}$ supplied to the gate of another transistor Tr2 to control the gains in the LNA 103 and attenuator 109.

The attenuator 109 operates to decrease a signal level received in the antenna 101. When the received signal intensity in the antenna is not so high, the attenuator 109 does not operate to decrease the received signal level. On the other hand, when a signal of intense electronic field is inputted to the antenna 101, the attenuator 109 operates to prevent excessive power from being applied to the radio receiver.

Figure 2:
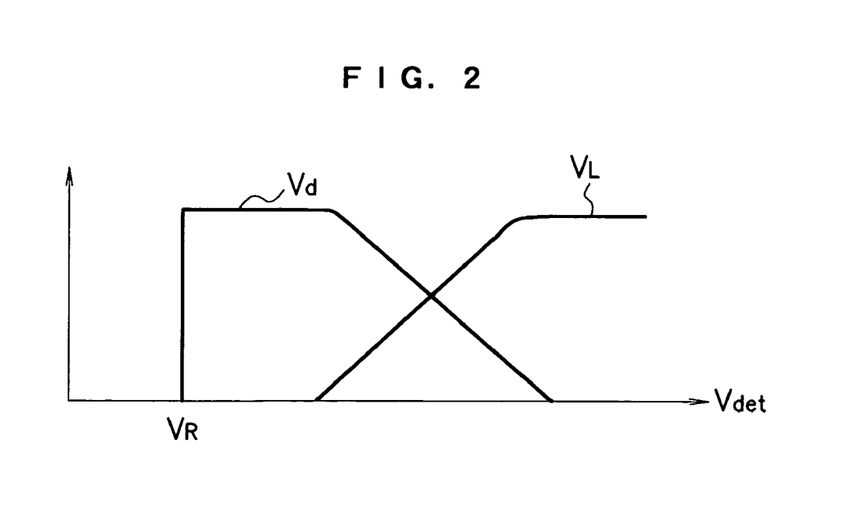
FIG. 2 is a diagram showing the operating characteristics of a differential amplifier.

The AGC operation in the radio receiver having the above-mentioned configuration will be now described referring to FIG. 2. FIG. 2 is a diagram showing the operating characteristics of the differential amplifier.

When an AGC voltage $V_{det}$ extracted by the detection circuit 107 is smaller than a reference voltage $V_R$ ($V_{det}<V_R$) because of the low intensity in the signal inputted from the antenna 101, both voltages $V_d$ and $V_L$ become zero ($V_d=0$, $V_L=0$), respectively appearing in the drain of the transistor Tr1 and the drain of the transistor Tr2. In this instance, no currency flows to the PIN diode of the attenuator 109 and the attenuation of the received signal level is not performed. Besides, the power supply voltage $V_{LNA}$ is applied to the LNA 103 to perform the amplification with the maximum gain.

When an AGC voltage $V_{det}$ extracted by the detection circuit 107 is greater than a reference voltage $V_R$ ($V_{det}>V_R$) because the intensity of the signal inputted from the antenna 101 is high to a certain extend, the voltage $V_d$ becomes other than zero ($V_d\neq0$) as shown in FIG. 2 allowing currency to flow to the PIN diode of the attenuator 109. Thus, the attenuation of the received signal level is performed and the differential amplifier 108 achieves a balance when the voltage $V_{det}$ becomes equivalent to the voltage $V_R$ ($V_{det}=V_R$).

Moreover, when the intensity of the signal inputted from the antenna 101 is extremely high ($V_{det}>>V_R$), the switch of the differential amplifier 108 is changed and the voltage $V_L$ becomes other than zero ($V_L\neq0$) as shown in FIG. 2. Thus, the differential voltage between the power supply voltage $V_{LNA}$ and voltage $V_L$ ($V_{LNA}-V_L$) is applied to the LNA 103 to reduce the amplification gain in the LNA 103.

There is Patent Document 1, for example, disclosing a technology for adjusting a received signal level by controlling both an attenuation rate in an attenuator and an amplification rate in an AGC amplifier with the same way as in the above-mentioned radio receiver.

Patent Document 1: Japanese Patent Application Laid-open No. H6-253275

However, the AGC is performed only by the analog circuit in such AGC circuit shown in FIG. 1. Also, with the technology mentioned in Patent Document 1, the amplification amount in the AGC amplifier is adjusted in an analog fashion, while the attenuation amount in the attenuator is digitally adjusted by the controlling part. The proper AGC is not necessarily performed with an analog fashion because the intelligent control is difficult. Specifically, if the intelligent control is performed with an analog circuit, the circuit needs to be extremely complicated, resulting in instability in its operation.

Another technology which allows a digital signal processor (DSP) to determine a correct received signal level by calculation according to level detected signals of first IF signal and second IF signal is suggested (see Patent Document 2 as an example).

Patent Document 2: Japanese Patent Application Laid-open No. H11-331288

However, the technology described in Patent Document 2 is for the DSP to calculate the received signal level based on the total gain obtained by synthesizing both of the level detected signals. The technology cannot realize the proper AGC according to received signal levels in each band.

SUMMARY OF THE INVENTION

The present invention is achieved to solve these problems and has an object to perform AGC accurately in an appropriate form by classifying a received signal level into each of a plurality of bands and judging the classified levels in a digital fashion.

To achieve the above-mentioned object, in an automatic gain control device of the present invention, the received signal level is detected in each of a plurality of frequency bands and converted to a digital signal. Then, the level detected digital signal in each band is used in a digital signal processor to determine the enabled/disabled state of the gain adjustment and a gain adjustment amount.

For example, when a value of the level detected digital signal of narrow band including a desired frequency is smaller than a prescribed value, the gain adjustment is controlled not to be performed even a value of the level detected digital signal of wide band is larger than a prescribed value.

In another embodiment of the present invention, when a value of the level detected digital signal is larger than a prescribed value but not exceeding a limit level where a gain is adjustable in the second gain adjustment part, the gain of the second gain adjustment part is adjusted so that the value of the level detected digital signal is equivalent to the prescribed value. If a value of the level detected digital signal exceeds the gain adjustable limit level in the second gain adjustment part, the gain in the first gain adjustment part is adjusted while keeping a gain adjusting amount in the second gain adjustment part around the limit level.

According to the present invention having the above configuration, an enabled/disabled state of the gain adjustment and a gain adjustment amount, if in the enabled state, are intelligently judged by the digital signal processor based on the received intensity level detected in each of a plurality of frequency bands, a gain adjustment can be performed according to the judgment result, and an accurate AGC with an appropriate form can be realized.

DETAILED DESCRIPTION OF THE PREFERRED EMBODIMENTS

Figure 3:
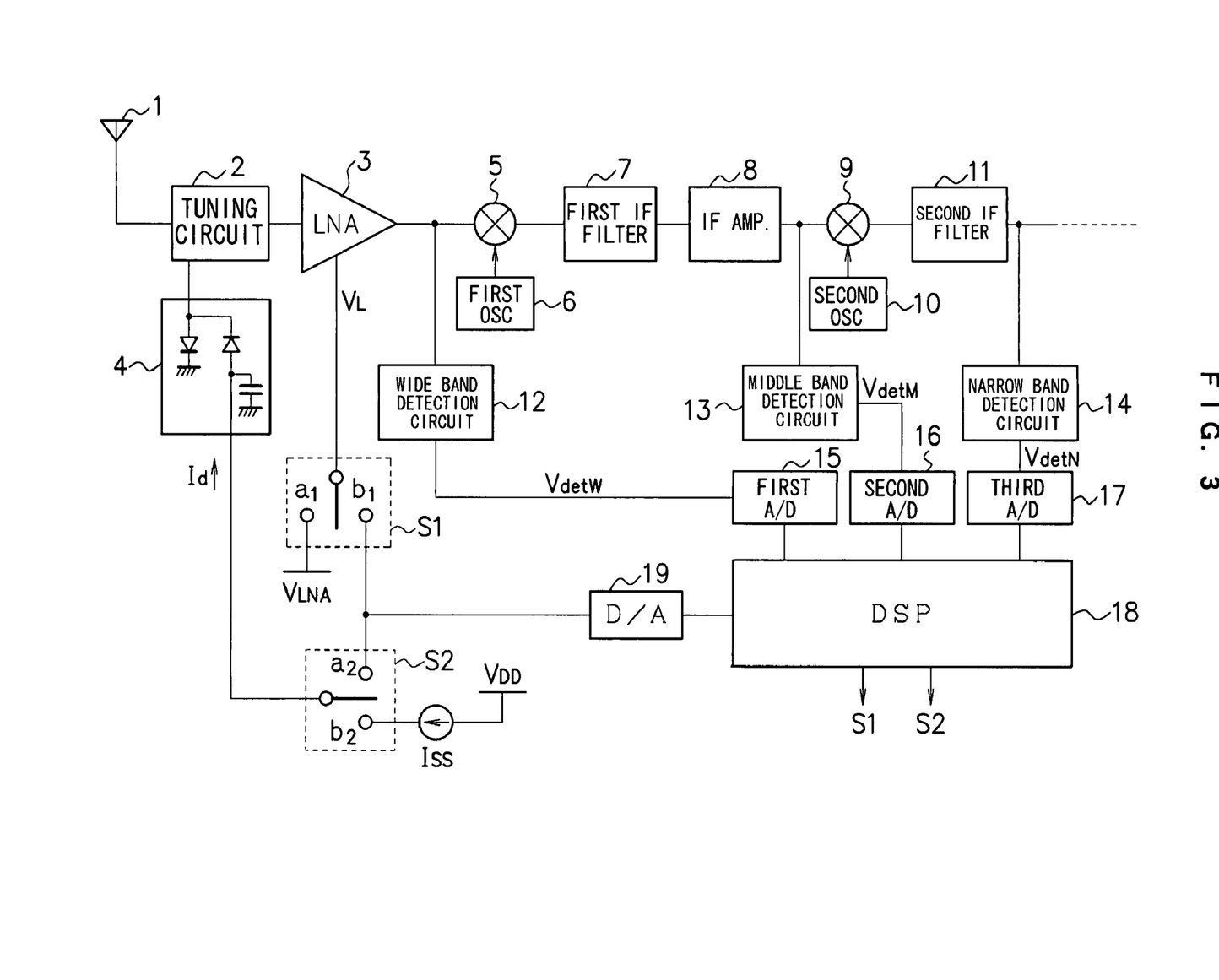
FIG. 3 is a diagram showing an example of a partial configuration of a radio receiver including an AGC circuit of the present embodiment.

One embodiment of the present invention will now be explained referring to drawings. FIG. 3 is a diagram showing an example of a partial configuration of a radio receiver including an AGC circuit of the present embodiment. In FIG. 3, a tuning circuit 2 and an LNA 3 constitute a high frequency amplifier circuit. In general, the high frequency amplifier circuit selectively amplifies a broadcast wave in the particular frequency band among broadcast waves received in an antenna 1.

The LNA 3 corresponding to a first gain adjustment part of the present invention amplifies a broadcast wave in the particular frequency band outputted from the tuning circuit 2 and outputs the amplified wave. An attenuator 4 corresponding to a second gain adjustment part of the present invention is connected to the tuning circuit 2 and operates to reduce a signal level received in the antenna 1.

Figure 4A:
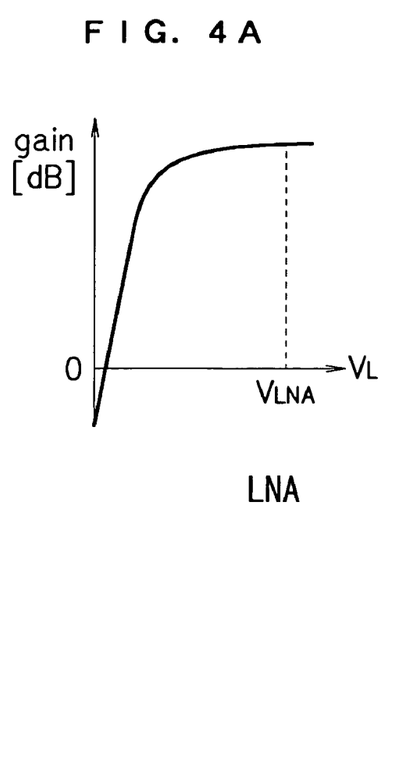
FIGS. 4A and 4B are diagrams showing the operating characteristics of an LNA and an attenuator.
Figure 4B:
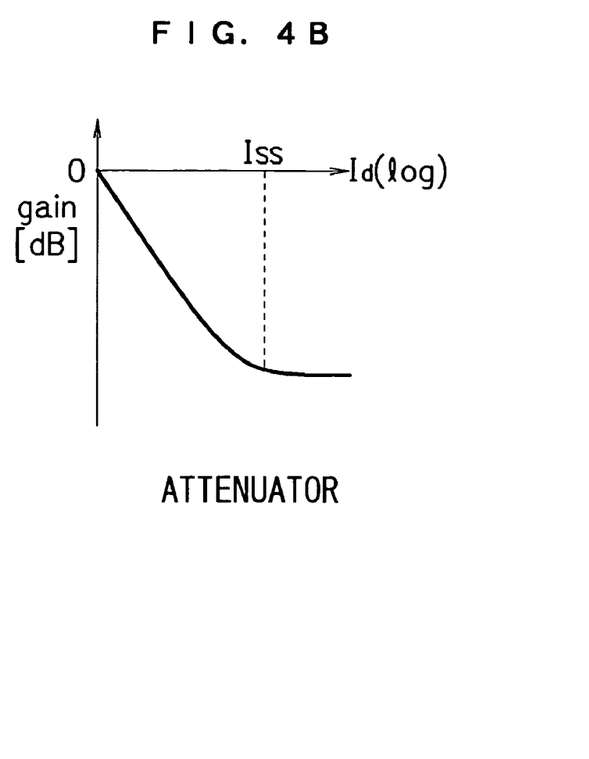

FIGS. 4A and 4B are diagrams showing the operating characteristics of the LNA 3 and the attenuator 4. As shown in FIG. 4A, the gain in the LNA 3 is decided depending on a voltage $V_L$ applied to the control terminal. The gain of the LNA 3 saturates around a voltage $V_{LNA}$ and reaches the maximum when the voltage $V_{LNA}$ is applied. As shown in FIG. 4B, the gain of the attenuator 4 is determined depending on a current $I_d$. The gain of the attenuator 4 saturates around a current $I_{ss}$ and reaches the minimum when the current $I_{ss}$ is applied.

At the initial state, the LNA 3 is regulated to have the maximum gain. When the received intensity of the signal inputted in the antenna is not so high, the attenuator 4 does not operate to reduce the level of the received signal. Therefore, the amplification is executed with the maximum gain by the LNA 3. On the other hand, when the signal in an intense electronic field is inputted in the antenna 1, the attenuator 4 operates not to apply the excess power to the radio receiver. In the case that the attenuator 4 saturates and exceeds the adjustable limit level due to an extremely high intensity of the antenna inputted signal, the gain in the LNA 3 is reduced not to apply the excess power to the radio receiver.

A first mixer circuit 5 and a first local oscillation circuit 6 constitute a first frequency converter. In the first frequency converter, a carrier signal outputted from the LNA 3 and a local oscillation signal outputted from the first local oscillation circuit 6 are mixed in the first mixer circuit 5 to convert the frequency, thereby a first intermediate frequency signal to be outputted is generated. A first IF filter 7 limits the band of the first intermediate frequency signal generated by the first mixer circuit 5 to produce an intermediate frequency signal of middle band including the desired frequency. An IF amplifier 8 amplifies the first intermediate frequency signal outputted from the first IF filter 7.

A second mixer circuit 9 and a second local oscillation circuit 10 constitute a second frequency converter. In the second frequency converter, the first intermediate frequency signal outputted from the IF amplifier 8 and a local oscillation signal outputted from the second local oscillation circuit 10 are mixed in the second mixer circuit 9 to convert the frequency, thereby a second intermediate frequency signal to be outputted is generated. A second IF filter 11 limits the band of the second intermediate frequency signal generated from the second mixer circuit 9 to produce an intermediate frequency signal of narrow band including the desired frequency.

Figure 5:
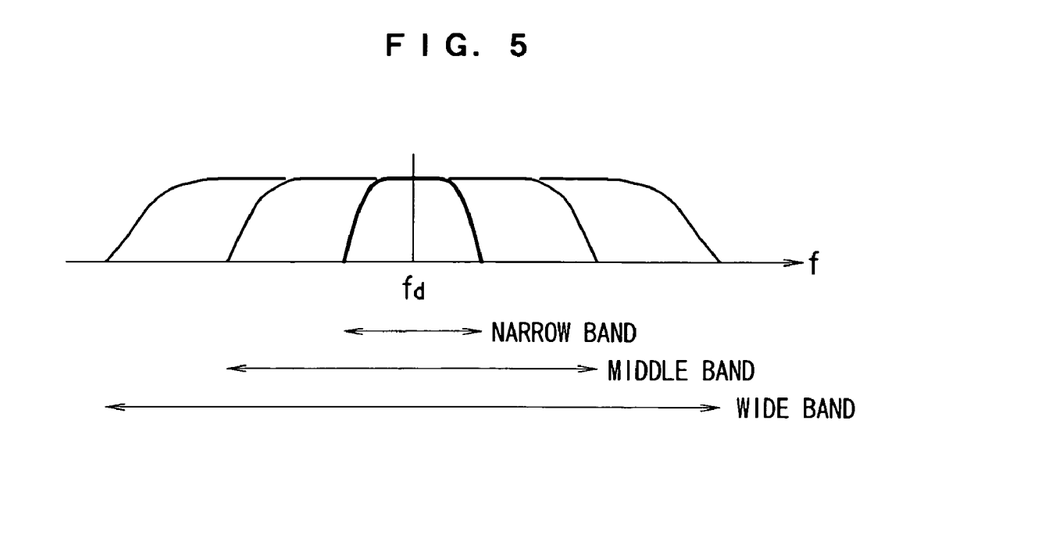
FIG. 5 is a diagram showing a plurality of frequency bands to be detected by a wide band detection circuit, middle band detection circuit, and narrow band detection circuit in the present embodiment.

A wide band detection circuit 12, middle band detection circuit 13, and narrow band detection circuit 14 collectively represent a level detection part of the present invention for detecting a received signal level in each of a plurality of frequency bands. A plurality of frequency bands to be detected in each of the detection circuits 12 to 14 is shown in FIG. 5.

In the wide band detection circuit 12, a high frequency amplification signal outputted from the LNA 3 is examined to detect a level of the voltage $V_{detW}$ of the signal included in the wide band having a desired frequency $f_d$. In the middle band detection circuit 13, the first intermediate frequency signal outputted from the first IF filter 8 is examined to detect a level of the voltage level $V_{detM}$ of the signal included in the middle band having the desired frequency $f_d$. In the narrow band detection circuit 14, the second intermediate frequency signal outputted from the second IF filter 11 is examined to detect a level of the voltage level $V_{detN}$ of the signal included in the narrow band having the desired frequency $f_d$.

A first A/D converter 15 converts the signal with the level detected voltage $V_{detW}$ of the wide band examined by the wide band detection circuit 12 to a digital signal. A second A/D converter 16 converts the signal with the level detected voltage $V_{detM}$ of the middle band examined by the middle band detection circuit 13 to a digital signal. A third A/D converter 17 converts the signal with the level detected voltage $V_{detN}$ of the narrow band examined by the narrow band detection circuit 14 to a digital signal. These A/D converters 15 to 17 collectively represent an A/D conversion part in the present invention.

A DSP 18 corresponding to a digital signal processor in the present invention determines the enable/disable state of the gain adjustment by the LNA 3 and the attenuator 4 and a gain adjustment amount based on the level detected digital signal in each band outputted from each of a plurality of A/D converters 15 to 17. If the gain adjustment is performed, the digital signal which value is corresponding to the determined gain adjustment amount is generated to be outputted.

Figure 6:
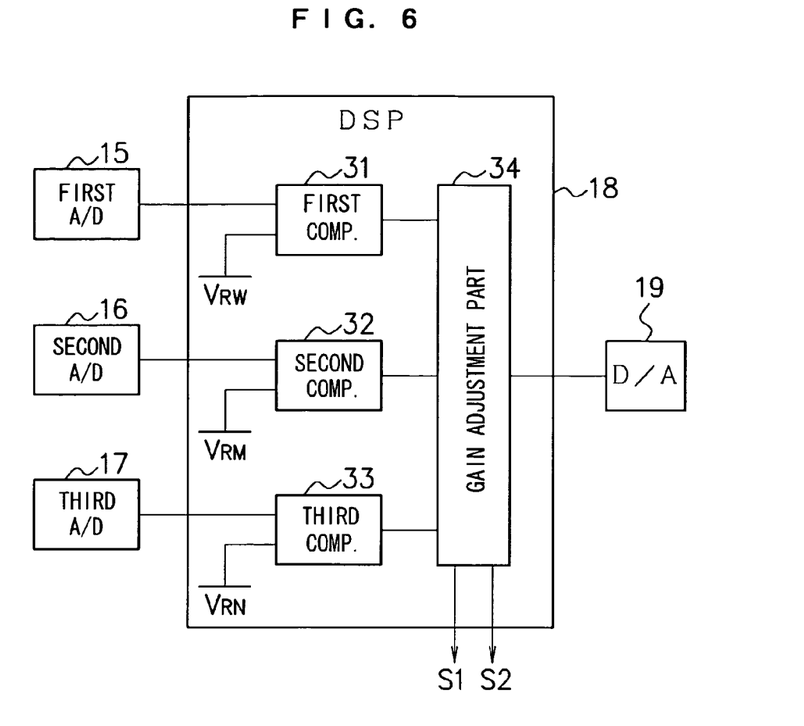
FIG. 6 is a diagram showing an example of a schematic configuration of a DSP in the present embodiment.

As shown in FIG. 6, the DSP 18 comprises a first comparator 31, second comparator 32, third comparator 33, and gain adjustment part 34. The comparator 31 compares a digital signal corresponding to the level detected voltage $V_{detW}$ of the wide band outputted from the first A/D converter 15 with a digital signal corresponding to a reference voltage $V_{RW}$ for the wide band and outputs a error signal according to the magnitude correlation. Specifically, an error signal of "1" is outputted when $V_{detW}$ is larger than $V_{RW}$ ($V_{detW} > V_{RW}$), otherwise an error signal of "0" is outputted.

The second comparator 32 compares a digital signal corresponding to the level detected voltage $V_{detM}$ of the middle band outputted from the second A/D converter 16 with a digital signal corresponding to a reference voltage $V_{RM}$ for the middle band and outputs an error signal according to the magnitude correlation. Specifically, an error signal of "1" is outputted when $V_{detM}$ is larger than $V_{RM}$ ($V_{detM} > V_{RM}$), otherwise an error signal of "0" is outputted.

The third comparator 33 compares a digital signal corresponding to the level detected voltage $V_{detN}$ of the narrow band outputted from the third A/D converter 17 with a digital signal corresponding to a reference voltage $V_{RN}$ for the narrow band and outputs an error signal according to the magnitude correlation. Specifically, an error signal of "1" is outputted when $V_{detM}$ is larger than $V_{RM}$ ($V_{detM} > V_{RM}$), otherwise an error signal of "0" is outputted.

Figure 7A:
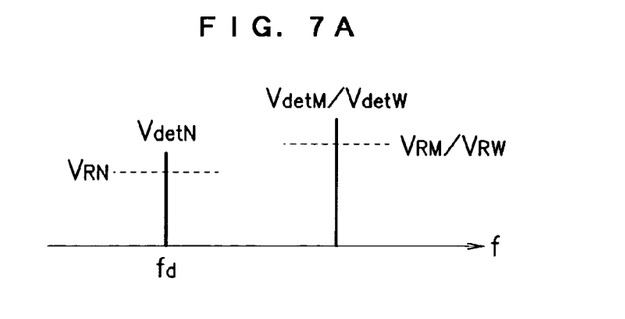
FIGS. 7A and 7B are diagrams showing pattern examples of each signal level in wide band, middle band, and narrow band.

The gain adjustment part 34 determines the enabled/disabled state of the gain adjustment by the LNA 3 and the attenuator 4 and a gain adjustment amount based on the error signal outputted from each comparator 31 to 33. For example, when the level detected voltage $V_{detN}$ of the narrow band is greater than the reference voltage $V_{RN}$ for the narrow band (when an error signal of "1" is outputted from the third comparator 33) as shown in FIG. 7A, the gain adjustment part 34 operates so that the gain adjustment is performed by the LNA 3 and the attenuator 4.

In this instance, the DSP 18 adjusts the gains of the LNA 3 and the attenuator 4 to satisfy the formula: $V_{detN} = V_{RN}$, for example. When the level detected voltage $V_{detW}$ of the wide band is greater than the reference voltage $V_{RW}$ for the wide band (when an error signal of "1" is outputted from the first comparator 31) or when the level detected voltage $V_{detM}$ of the middle band is greater than the reference voltage $V_{RM}$ for the middle band (when an error signal of "1" is outputted from the second comparator 32), the gains of the LNA 3 and the attenuator 4 may be adjusted to satisfy the formula: $V_{detW} = V_{RW}$ or $V_{detM} = V_{RM}$, but preferably the gains be adjusted to satisfy the formula: $V_{detN} = V_{RN}$.

Figure 7B:
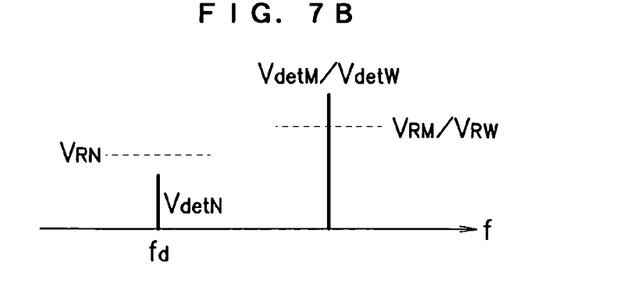

On the other hand, when the level detected voltage $V_{detN}$ of the narrow band is smaller than the reference voltage $V_{RN}$ for the narrow band (when an error signal of "0" is outputted from the third comparator 33") as shown in FIG. 7B, the gain adjustment part 34 operates so that the gain adjustment is not performed by the LNA 3 and the attenuator 4 even if the level detected voltage $V_{detM}$ of the middle band or the level detected voltage $V_{detW}$ of the wide band is larger than the respective reference voltage $V_{RM}$ or $V_{RW}$.

As the gain adjustments by the LNA 3 and the attenuator 4 reduce the gain of the received signal on the whole, the main signal level of the desired frequency $f_d$ included in the narrow band is also lowered. If the AGC is performed even when the main signal level is low at the first place as shown in FIG. 7B, the gain is further reduced which results in the low received sensitivity of the main signal. Therefore, the LNA 3 and the attenuator 4 are controlled not to perform the gain adjustment in this instance for maintaining a received sensitivity of the main signal at a relatively preferable degree.

Since the level of the received signal was collectively examined without classifying into a plurality of frequency bands in the conventional AGC circuit, the gain of the received signal was reduced, even if the received intensity of the main signal was low, when the signal of the intensity electronic field exists in the middle band or wide band (such as a frequency band of the other station away from the desired frequency of the main signal). Therefore, the received sensitivity of the main signal could be deteriorated. Opposingly, according to this embodiment, the received intensities in narrow band, middle band, and wide band are independently detected and the enabled/disabled state of the AGC is determined according to the detection results, thereby the enabled/disabled state of the gain adjustment can be properly controlled.

By the way, when the gain adjustment is performed by the LNA 3 and the attenuator 4 under the condition wherein the formula: $V_{detN} > V_{RN}$ is satisfied as shown in FIG. 7A, even if the formula: $V_{detW} > V_{RW}$ or $V_{detM} > V_{RM}$ is valid, the received sensitivity of the main signal can be constantly maintained in the best state through the gain adjustment for satisfying the formula: $V_{detN} = V_{RN}$. Such gain adjustment is enabled by the gain adjustment part 34 in the DSP 18.

In FIG. 3, a D/A converter 19 converts a digital signal based on an amount of the gain adjustment determined by the DSP 18 to an analog signal and outputs the analog signal as an AGC voltage. Two switches S1 and S2 are connected to the output side of the D/A converter 19. The first switch S1 is for selecting either an AGC voltage based on the gain adjustment amount determined by the DSP 18 or a constant voltage $V_{LNA}$ for providing the maximum gain to the LNA 3 to be supplied to the control terminal of the LNA 3.

The second switch S2 is for selecting either an AGC current produced by applying the AGC voltage based on the gain adjustment amount determined by the DSP 18 or a constant current source $I_{ss}$ for remaining a gain adjustment amount by the attenuator 4 around the gain adjustable limit level (saturation level) to be supplied to the attenuator 4. These switches S1 and S2 are controlled by the DSP 18.

The AGC operation in the radio receiver of the present embodiment having the above configuration will now be described. When an A/D conversion value corresponding to the level detected voltage $V_{detN}$ for the narrow band extracted by the narrow band detection circuit 14 is smaller than a data value corresponding to the reference voltage $V_{RN}$ ($V_{detN} < V_{RN}$) due to a low intensity of the signal inputted from the antenna 1, an error signal of "0" is outputted from the third comparator 33 of the DSP 18 shown in FIG. 6.

At this time, the DSP 18 changes the first switch S1 and second switch S2 to terminal $a_1$ side and terminal $a_2$ side, respectively. Also, the DSP 18 outputs zero data to the D/A converter 19 (or outputs no data) so that the AGC voltage becomes zero. In this situation, no current $I_d$ is supplied to the PIN diode of the attenuator 4 and the attenuation for the received signal level is not performed, while the power supply voltage $V_{LNA}$ is applied to the LNA 3 to perform the amplification with the maximum gain.

When the A/D conversion value corresponding to the level detected voltage $V_{detN}$ of the narrow band extracted by the narrow band detection circuit 14 is larger than a data value corresponding to the reference voltage $V_{RN}$ ($V_{detN} > V_{RN}$) because the intensity of the signal inputted from the antenna 1 is increased to some extent, an error signal of "1" is outputted from the third comparator 33 of the DSP 18 shown in FIG. 6.

At this time, the DSP 18 switches the first switch S1 and second switch S2 to terminal $a_1$ side and terminal $a_2$ side, respectively. Also, the DSP 18 outputs a data value to the D/A converter 19 so that the AGC voltage becomes other than zero. The data value preliminary determined in a table and the like may be outputted depending on how much the level detected voltage $V_{detN}$ of the narrow band exceeds the reference voltage $V_{RN}$.

In this case, while the amplification is still performed with the maximum gain based on the power supply voltage $V_{LNA}$ in the LNA 3, the current $I_d$ is supplied to the attenuator 4 to perform the attenuation for the received signal level. The more AGC current $I_d$ obtained by increasing a data value to be outputted from the DSP 18, the more attenuation amount of the attenuator 4 (see FIG. 4B). The DSP 18 outputs the data value until the formula: $V_{detN} = V_{RN}$ is satisfied (or until the error signal outputted from the third comparator 33 is changed from "1" to "0") to perform the AGC of the attenuator 4.

Moreover, when the intensity of the signal inputted from the antenna 1 is extremely high ($V_{detN} \gg V_{RN}$), exceeding the gain adjustable limit level (saturation level) in the attenuator 4, the DSP 18 switches the first switch S1 and second switch S2 to terminal $b_1$ side and terminal $b_2$ side, respectively. The signal intensity exceeding the saturation level of the attenuator 4 is recognized, for example, when it is detected that the level detected voltage $V_{detN}$ of the narrow band does not decrease in spite of the data value outputted from the DSP 18 to the D/A converter 19 and that an error signal of "1" is continuously outputted from the third comparator 33 for a prescribed period of time or more.

In the above case, the DSP 18 outputs the data value to the D/A converter 19 so that the AGC voltage becomes other than zero, providing that the AGC voltage is supplied to the LNA 3 through the first switch S1. The DSP 18 adjusts the output data value so that the AGC voltage is lower than the power supply voltage $V_{LNA}$ (see FIG. 4A). On the other hand, the constant current $I_{ss}$ is supplied to the attenuator 4 through the second switch S2.

Through the above process, the attenuation amount by the attenuator 4 is maintained around the saturation level, while the amplification gain in the LNA 3 is reduced, thereby the level detected voltage $V_{detN}$ of the narrow band is lowered exceeding the saturation level of the attenuator 4. The DSP 18 outputs a data value until the formula: $V_{detN} = V_{RN}$ is satisfied (or until the error signal outputted from the third comparator 33 is changed from "1" to "0") to operate the AGC of the LNA 3.

According to the embodiment mentioned above in details, the intensity of the received signal is detected by classifying into individual intensity levels i.e. narrow band, middle band, and wide band, each detected signal is converted to the digital signal, and the enabled/disabled state of the AGC and a gain adjustment amount are determined in the DSP 18. With these steps, the adjustment or non-adjustment for the gain, the degree of the gain adjustment, if necessary, and the like can be appropriately controlled and the AGC can be performed with an optimal form.

Although the DSP 18 controls the switchover in the switches S1 and S2 provided as shown in FIG. 3 in the embodiment, it is not limiting the configuration of the switch part. For example, an on/off switch S3 may be additionally provided between a couple of the switches S1 and S2 and the D/A converter 19 as shown in FIG. 8A.

Figure 8A:
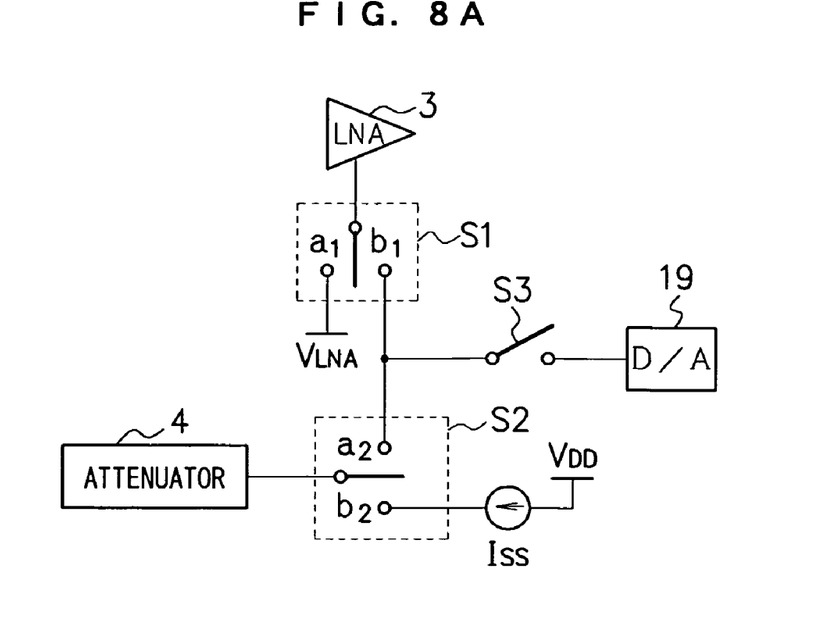
FIGS. 8A and 8B are diagrams showing other configuration examples of a switch part in the present embodiment.

In the configuration example of FIG. 8A, the DSP 18 turns the switch S3 off when the intensity of the signal inputted from the antenna 1 is low and the formula: $V_{detN} < V_{RN}$ is satisfied. On the contrary, when the formula: $V_{detN} > V_{RN}$ is satisfied due to a high intensity of the antenna inputted signal, the DSP 18 turns the switch S3 on. In this way, the AGC voltage based on the data value outputted from the DSP 18 can be completely separated from both the LNA 3 and the attenuator 4 when the gain adjustments in both the LNA 3 and the attenuator 4 are not performed, resulting in the prevention of malfunction.

Figure 8B:
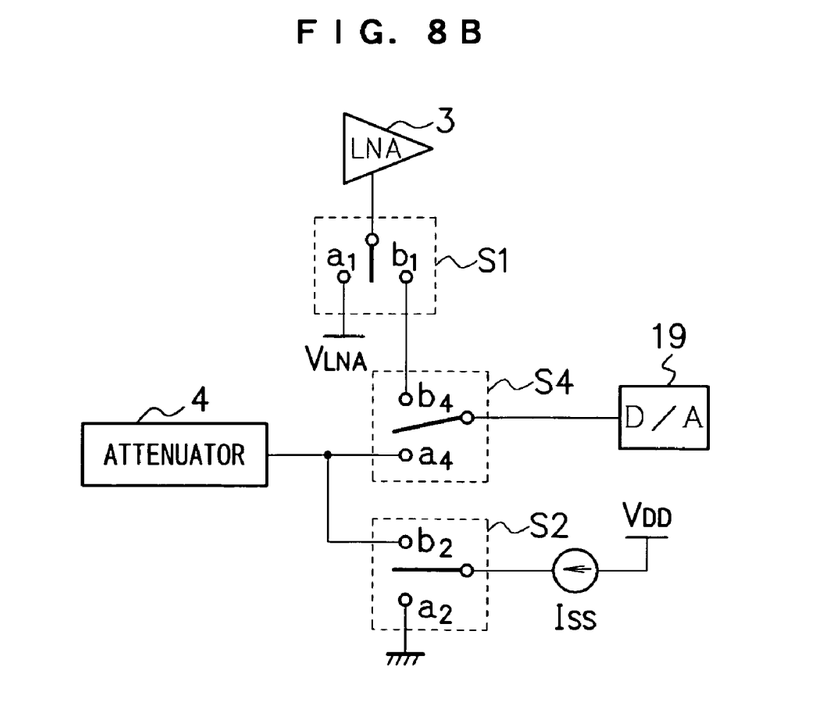

As shown in FIG. 8B, a switch S4 for selectively supplying the AGC voltage based on the gain adjustment amount determined by the DSP 18 to either the LNA 3 or the attenuator 4 may be provided between a couple of the switches S1 and S2 and the D/A converter 19. In the configuration as in FIG. 8B, the first switch S1 and fourth switch S4 constitute the first switch part in the present invention. The second switch S2 and fourth switch S4 constitute the second switch part in the present invention.

In the configuration example in FIG. 8B, when the intensity of the antenna inputted signal is low to satisfy the formula: $V_{detN} < V_{RN}$, the DSP 18 changes the first switch S1, second switch S2, and fourth switch S4 to terminals $a_1$, $a_2$, and $a_4$, respectively. Even when the intensity of the antenna inputted signal is higher to some extent, satisfying the formula: $V_{detN} > V_{RN}$, switches S1, S2, and S4 are respectively changed as mentioned above unless the intensity exceeds the saturation level of the attenuator 4. Furthermore, when the intensity of the antenna inputted signal is extremely high ($V_{detN} \gg V_{RN}$), exceeding the gain adjustable limit level (saturation level) in the attenuator 4, the DSP 18 changes the first switch S1, second switch S2, and fourth switch S4 to terminals $b_1$, $b_2$, and $b_4$, respectively.

Figure 9:
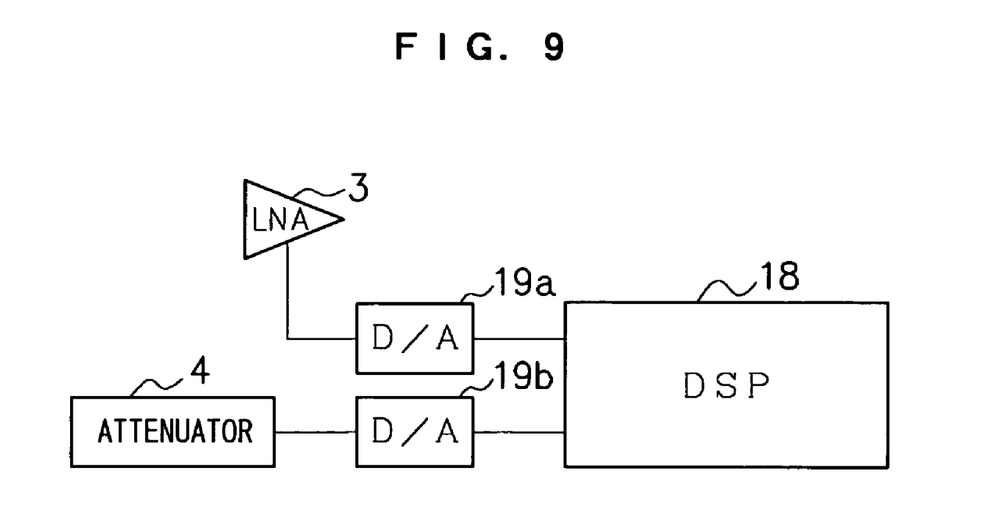
FIG. 9 is a diagram of other configuration example to realize a gain adjustment of an LNA and an attenuator.

Although each gain adjustment by the LNA 3 or the attenuator 4 is individually performed by the switchover operation in the switch part as mentioned in the above embodiment, this is not limiting the embodiment to the example using the switch part. For example, as shown in FIG. 9, the data for the gain adjustments by the LNA 3 and the attenuator 4 may be individually outputted from the DSP 18 through two D/A converters 19a and 19b.

In this case, the data value to be outputted to the D/A converter 19a for the LNA 3 are variable within the AGC voltage range of 0-$V_{LNA}$ and the data value to be outputted to the D/A converter 19b for the attenuator 4 are variable within the AGC current range of 0-$I_{ss}$. Since two gain adjustment systems are completely independent, the attenuation amount can be maintained at maximum by outputting the data value corresponding to the AGC current $I_{ss}$ to the D/A converter 19b for the attenuator 4, while the amplification gain of the LNA 3 can be easily reduced with the variable data value to be outputted to the D/A converter 19a for the LNA 3.

Figure 10:
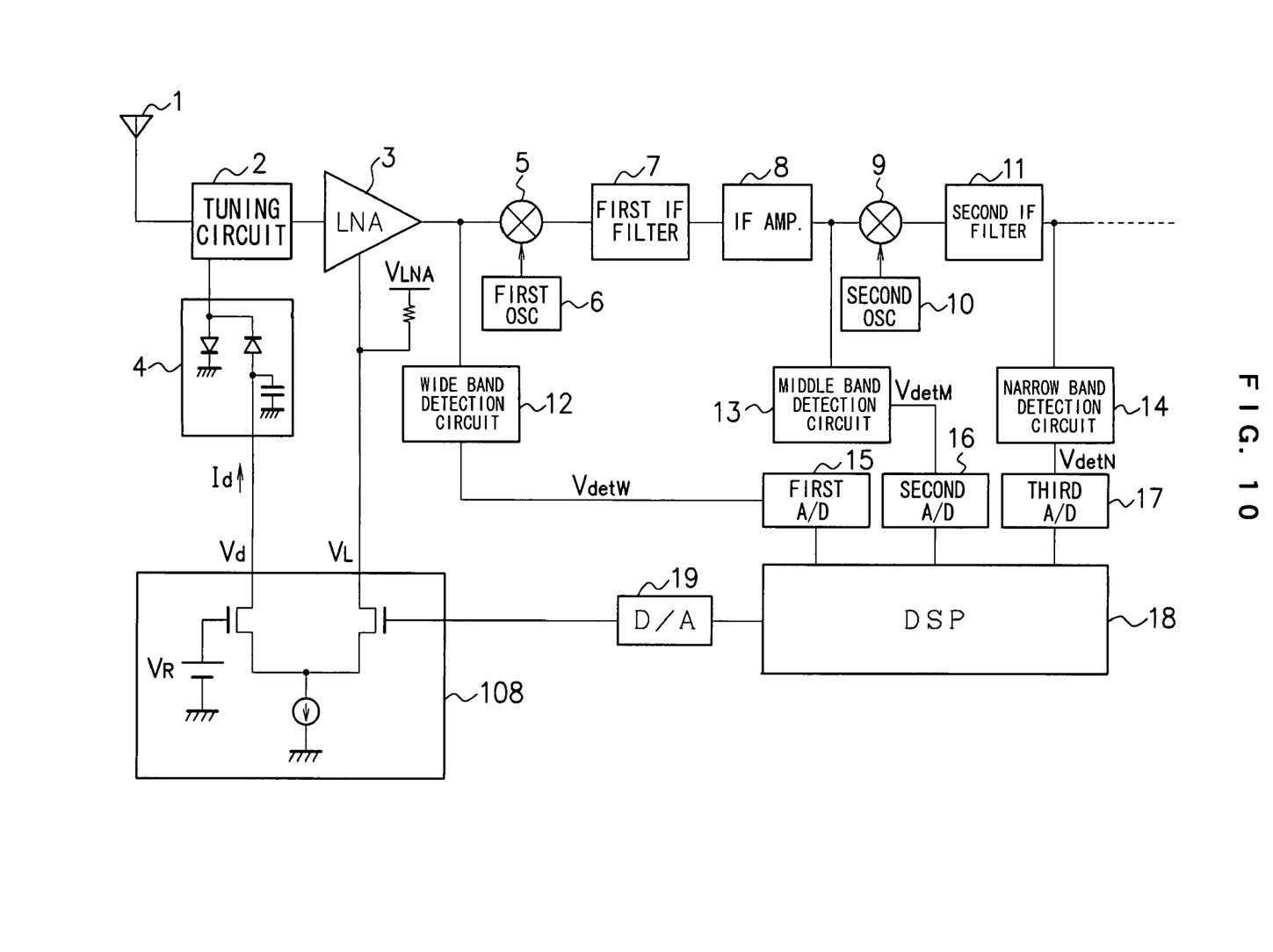
FIG. 10 is a diagram of other configuration example of an AGC circuit in the present embodiment.

The differential amplifier 108 shown in FIG. 1 may be used instead of the switches S1 and S2 shown in FIG. 3. The configuration example is shown in FIG. 10 explaining the switchover in an analog fashion between the gain adjustments of the LNA 3 and of the LNA 4. In this case, the DSP 18 can also perform the AGC intelligently according to the received levels in wide band, middle band, and narrow band. However, the switchover in a digital fashion between the gain adjustments of the LNA 3 and of the LNA 4 shown in FIG. 3 ensures the further reduction in the amplification gain of the LNA 3 while maintaining the attenuation amount of the attenuator 4 around the saturation level, thereby the AGC can be performed with high accuracy.

Figure 11:
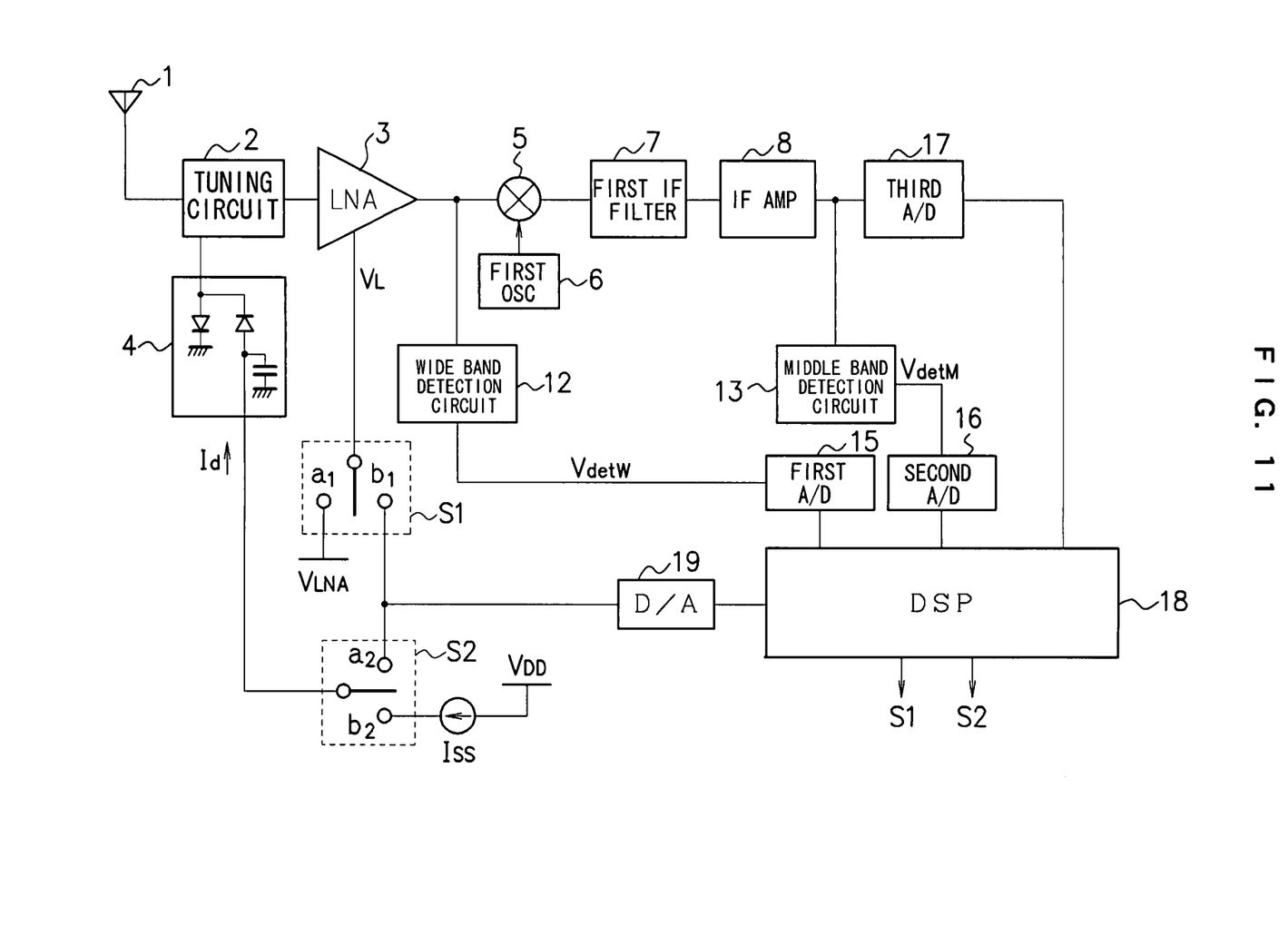
FIG. 11 is a diagram of still another configuration example of an AGC circuit in the present embodiment.

The above-mentioned embodiment explains an example wherein signals with the level detected voltages of each band examined in an analog fashion are converted to digital signals using three A/D converters 15 to 17, being inputted to the DSP 18 to be processed. However, this is not limiting the embodiment of the present invention. As shown in FIG. 11, for example, the first intermediate frequency signal outputted from the IF amplifier 8 may be immediately converted to the digital signal to be inputted to the DSP 18 using the third A/D converter 17. Then, the operations for the second IF filter 11 and the narrow band detection circuit 14 may be performed in a digital fashion inside of the DSP 18. In this case, the second IF filter 11 consists of a digital filter and the narrow band detection circuit 14 monitors the value of the digital signal itself.

In the above-mentioned embodiment wherein the received intensity of the narrow band is regarded as a reference, when the narrow band-level detected voltage $V_{detN}$ is smaller than the reference voltage $V_{RN}$ for the narrow band, the gain adjustments by the LNA 3 and the attenuator 4 are not allowed to be performed even the middle band-level detected voltage $V_{detM}$ or wide band-level detected voltage $V_{detW}$ is larger than the respective reference voltages $V_{RM}$ or $V_{RW}$. Therefore, as the received signal frequency is not necessarily classified into middle band and wide band, the frequency for the middle band and wide band may be examined collectively to detect its received intensity. Opposingly, the more complex AGC may be performed by the DSP 18 according to the received intensity in each narrow band, middle band, and wide band.

By the way, the above-described embodiment is not more than a specific example in implementing the present invention and this should not be interpreted as restricting the technological scope of the present invention. That is, the invention may be embodied in other specific forms without departing from the spirit or essential characteristic thereof.

INDUSTRIAL APPLICABILITY

An automatic gain control device of the present invention is useful for various types of wireless communication devices typified by a radio receiver, TV receiver, and the like in which the gain adjustment of the received signal need to be performed.

What is claimed is:

1. An automatic gain control device, comprising:
a first gain adjustment part for amplifying the gain of a received signal;
a second gain adjustment part for reducing the gain of said received signal;
a level detection part to detect levels of said received signal in each of a plurality of frequency bands;
an A/D converter to convert level detected signals in each band detected by said level detection part to digital signals; and
a digital signal processor to determine the enabled/disabled state of the gain adjustment by said first gain adjustment part and said second gain adjustment part and a gain adjustment amount based on level detected digital signals of each band outputted from said A/D converter,
wherein said digital signal processor adjusts the gain of said second gain adjustment part so that a value of the level detected digital signal outputted from said A/D converter becomes equivalent to a prescribed value when the value of the level detected digital signal is larger than said prescribed value, but not exceeding a gain adjustable limit level in said second gain adjustment part, and adjusts the gain of said first gain adjustment part while maintaining a gain adjustment amount of said second adjustment part around said limit level when the value of the level detected digital signal exceeds said limit level.

2. An automatic gain control device, comprising:
a first gain adjustment part for amplifying the gain of a received signal;
a second gain adjustment part for reducing the gain of said received signal;
a level detection part to detect levels of said received signal in each of a plurality of frequency bands;
an A/D converter to convert level detected signals in each band detected by said level detection part to digital signals; and
a digital signal processor to determine the enabled/disabled state of the gain adjustment by said first gain adjustment part and said second gain adjustment part and a gain adjustment amount based on level detected digital signals of each band outputted from said A/D converter,
wherein said level detection part detects levels of said received signal in each of a first band including a desired frequency and a second band including said desired frequency which is broader than said first band; and
said digital signal processor controls said first gain adjustment part and said second adjustment part not to perform gain adjustments when a value of the level detected digital signal pertaining to the first band outputted from said A/D converter is smaller than a first prescribed value even a value of the level detected digital signal pertaining to the second band outputted from said A/D converter is larger than a second prescribed value.

3. The automatic gain control device according to claim 2, wherein said digital signal processor adjusts the gains of said first gain adjustment part and said second gain adjustment part so that a value of the level detected digital signal pertaining to the first band outputted from said A/D converter becomes equivalent to said first prescribed value when the value of the level detected digital signal pertaining to the first band is larger than said first prescribed value.

4. An automatic gain control device, comprising:

a first gain adjustment part for amplifying the gain of a received signal;

a second gain adjustment part for reducing the gain of said received signal;

a level detection part to detect levels of said received signal in each of a plurality of frequency bands;

an A/D converter to convert level detected signals in each band detected by said level detection part to digital signals; and a digital signal processor to determine the enabled/disabled state of the gain adjustment by said first gain adjustment part and said second gain adjustment part and a gain adjustment amount based on level detected digital signals of each band outputted from said A/D converter, further comprising;

a first switch part for a selective switchover between an AGC voltage based on the gain adjustment amount determined by said digital signal processor and a constant voltage for providing the maximum gain to said first gain adjustment part to be supplied to said first gain adjustment part; and a second switch part for a selective switchover between an AGC current based on the gain adjustment amount determined by said digital signal processor and a constant current for maintaining a gain adjustment amount of said second gain adjustment part around a gain adjustable limit level to be supplied to said second gain adjustment part;

wherein the switchover operation in said first and second switch parts is performed by said digital signal processor.

5. The automatic gain control device according to claim 4, wherein said digital signal processor controls said first switch part and said second switch part to change respectively to said constant voltage side and said AGC current side when a value of the level detected digital signal outputted from said A/D converter is smaller than a prescribed value and when a value of the level detected digital signal outputted from said A/D converter is larger than said prescribed value, but not exceeding the gain adjustable limit level in said second gain adjustment part, and controls said first switch part and said second switch part to change respectively to said AGC voltage side and said constant current side when the value of the level detected digital signal outputted from said A/D converter exceeds the gain adjustable limit level in said second gain adjustment part.

* * * * *

UNITED STATES PATENT AND TRADEMARK OFFICE
CERTIFICATE OF CORRECTION

PATENT NO.         : 7,561,863 B2
APPLICATION NO. : 11/441055
DATED              : July 14, 2009
INVENTOR(S)       : Takeshi Ikeda et al.

It is certified that error appears in the above-identified patent and that said Letters Patent is hereby corrected as shown below:

On the Title Page Item (73) Assignee to read as follows:

Niigata Seimitsu Co., Ltd., Jyoetsu-shi (JP); and Ricoh Co. Ltd., Tokyo (JP)

Signed and Sealed this

Twentieth Day of October, 2009

David J. Kappos
*Director of the United States Patent and Trademark Office*